(12) United States Patent
Shin

(10) Patent No.: US 6,243,309 B1
(45) Date of Patent: Jun. 5, 2001

(54) SEMICONDUCTOR MEMORY DEVICE HAVING PARALLEL TEST MODE FOR SIMULTANEOUSLY TESTING MULTIPLE MEMORY CELLS

(75) Inventor: Jong-Kyeong Shin, Ichon (KR)

(73) Assignee: Hyundai Electronics Industries Co., Ltd., Ichon (KR)

(*) Notice: Subject to any disclaimer, the term of this patent is extended or adjusted under 35 U.S.C. 154(b) by 0 days.

(21) Appl. No.: 09/552,702

(22) Filed: Apr. 19, 2000

(30) Foreign Application Priority Data

Apr. 19, 1999 (KR) .................................................. 99-13751

(51) Int. Cl.[7] .................................................. G11C 29/00
(52) U.S. Cl. ........................ 365/201; 365/63; 365/230.03
(58) Field of Search .................................... 365/201, 202, 365/230.03, 63, 194

(56) References Cited

U.S. PATENT DOCUMENTS

| 5,535,164 | 7/1996 | Adams et al. |
| 5,561,636 | 10/1996 | Kirihata et al. |
| 5,959,911 | * 9/1999 | Krause et al. ........................ 365/201 |
| 6,119,249 | * 9/2000 | Landry ................................ 714/718 |

FOREIGN PATENT DOCUMENTS

| 4-121900 | 4/1992 | (JP) | G11C/29/00 |
| 05134004 | 5/1993 | (JP) | G01R/31/28 |
| 07085699 | 3/1995 | (JP) | G11C/29/00 |
| 09259600 | 10/1997 | (JP) | G11C/29/00 |
| 10055695 | 2/1998 | (JP) | G11C/29/00 |

* cited by examiner

Primary Examiner—David Nelms
Assistant Examiner—Gene N. Auduong
(74) Attorney, Agent, or Firm—Jacobson, Price, Holman & Stern, PLLC

(57) ABSTRACT

A semiconductor memory device having a parallel test mode for simultaneously testing a plurality of memory cells, comprising: a memory cell array having N numbers of memory cell blocks, wherein each memory cell block includes the plurality of memory cells and outputs first and second complementary data signals, the N being a positive integer; M numbers of first logical operation circuits responsive to a parallel test mode enable signal, each first logical operation circuit for carrying out a logical operation with respect to first and second complementary data signals outputted from at least two memory cell blocks, thereby generating first and second logical operation signals, wherein the N is greater than the M; a second logical operation circuit for carrying out the logical operation with respect to the first and second logical operation signals, thereby generating third and fourth logical operation signals; a pair of global data bus lines coupled between each of first logical operation circuit and said second logical operation circuit; and a buffer coupled to said second logical operation circuit for generating a test pass signal when the third and fourth logical operation signals are not the same as each other. Therefore, the semiconductor memory device can reduce the number of global data bus lines by using logical operation circuits as data compression circuits.

21 Claims, 8 Drawing Sheets

SEMICONDUCTOR MEMORY DEVICE HAVING PARALLEL TEST MODE FOR SIMULTANEOUSLY TESTING MULTIPLE MEMORY CELLS

TABLE 1

| State | Cell Data | D0 | D0Z | GRIO | GRIOZ | PU | PD | A | B | Data Output Pin |
|---|---|---|---|---|---|---|---|---|---|---|
| Read | Low | Low | High | High | Low | Low | High | High | High | Low |
|  | High | High | Low | Low | High | High | Low | Low | Low | High |

FIELD OF THE INVENTION

The present invention relates to a semiconductor memory device; and, more particularly, to a semiconductor memory device having a parallel test mode for simultaneously testing a plurality of memory cells.

DESCRIPTION OF THE PRIOR ART

Referring to FIG. 1, there is shown a block diagram illustrating a conventional dynamic random access memory (DRAM) device. As shown, the conventional DRAM device includes a memory cell array 100, sense amplifiers 200a to 200d, a data latch circuit 300, a data output driver 400 and a buffer 500. The memory cell array 100 includes memory cell blocks 100a to 100d. The memory cell blocks 100a to 100d include a plurality of memory cells (not shown), respectively.

A pair of data lines is coupled between one memory cell block and one sense amplifier, wherein one data line is complementary to the other data line. That is, a pair of two complementary data lines D0 and D0Z is coupled between the memory cell block 100a and the sense amplifier 200a. A pair of two complementary data lines D1 and D1Z is coupled between the memory cell block 100b and the sense amplifier 200b. A pair of two complementary data lines D2 and D2Z is coupled between the memory cell block 100c and the sense amplifier 200c. A pair of two complementary data lines D3 and D3Z is coupled between the memory cell block 100d and the sense amplifier 200d. The memory cell block 100a or 100d, to be selected for the sake of testing, transfers stored complementary data signals to the sense amplifier 200a or 200d. The corresponding sense amplifier 200a or 200d amplifies the complementary data signals. The sense amplifiers 200a to 200d transfer the amplified complementary data signals to global data bus lines GRIO and GRIOZ. The global data bus lines GRIO and GRIOZ are coupled between the sense amplifiers 200a to 200d and the data latch circuit 300. The data latch circuit 300 latches the amplified complementary data signals. The data latch circuit 300 sends the latched amplified complementary data signals to lines PU and PD. The lines PU and PD are coupled between the data latch circuit 300 and the data output driver 400. Lines A and B are coupled between the data output driver 400 and the buffer 500. The buffer 500 buffers data signals sent from the data output driver 400 and sends the buffered data signals to a data output pin. The buffer 500 includes PMOS and NMOS transistors.

As shown in Table 1, if a memory cell (not shown) of the memory cell block 100a is selected and stores a logic low signal as cell data, the complementary data lines D0 and D0Z convey logic low and high signals, respectively. At this time, the global data bus lines GRIO and GRIOZ convey the logic high and low signals amplified by the sense amplifier 200a, respectively. Then, the buffer 500 output the logic low signal conveyed through the data latch circuit 300 and data output driver 400 to the data output pin.

Further, as shown in Table 1, if the complementary data lines D0 and D0Z convey the logic high and low signals, respectively, the buffer 500 outputs the logic high signal to the data output pin.

TABLE 2

| State | D0 | D0Z | GRIO | GRIOZ | PU | PD | A | B | Data Output Pin |
|---|---|---|---|---|---|---|---|---|---|
| High Impedance | High | High | High | High | Low | Low | High | Low | Hi-Z |

As shown in Table 2, if the conventional DRAM device is in a high impedance (Hi-Z) state, the complementary data lines D0 and D0Z convey the logic high signals, respectively. Further, the global data bus lines GRIO and GRIOZ convey the logic high signals, respectively. As shown in Table 2, the data output pin has a Hi-Z signal having a level between the logic high and low signals.

Since the conventional DRAM device has a pair of global data bus lines as described above, only one memory cell contained in a memory cell block selected can be tested at a time. Accordingly, in order to simultaneously test each memory cell contained in the memory cell blocks, the conventional DRAM device needs additional global data bus lines and an additional circuit.

Referring to FIG. 2, there is shown a block diagram depicting a conventional semiconductor memory device having a parallel test mode, which simultaneously tests each memory cell contained in four memory cell blocks. As compared with the conventional DRAM device shown in FIG. 1, the conventional semiconductor memory device having the parallel test mode further includes a logical operation circuit 600 as a data compression circuit. The conventional DRAM device includes a pair of global data bus lines, while the conventional semiconductor memory device having the parallel test mode includes four pairs of global data bus lines.

A sense amplifier 200a amplifies complementary data signals received from a memory cell block 100a through complementary data lines D0 and D0Z. Global data bus lines GRIO1 and GRIO1Z convey the complementary data signals amplified by the sense amplifier 200a. Similarly, a sense amplifier 200d amplifies complementary data signals received from a memory cell block 100d through complimentary data lines D3 and D3Z.

Global data bus lines GRIO0 and GRIO0Z, GRIO1 and GRIO1Z, GRIO2 and GRIO2Z, and GRIO3 and GRIO3Z convey the complementary data signals amplified by the sense amplifiers 200b to 200d, respectively. The four pairs of global data bus lines are coupled to the logical operation circuit 600.

The logical operation circuit 600 receives four pairs of the amplified complementary data signals from four pairs of global data bus lines coupled to the logical operation circuit 600. After receiving the four pairs of the amplified complementary data signals, the logical operation circuit 600 carries out a logical operation with respect to the four pairs of the amplified complementary data signals. After carrying out the logical operation with respect to the four pairs of the amplified complementary data signals from the global data bus lines GRIO0 and GRIO0Z, GRIO1 and GRIO1Z, GRIO2 and GRIO2Z, and GRIO3 and GRIO3Z, the logical operation circuit 600 outputs a pair of logical operation signals through lines CU and CD.

A data latch circuit 300 latches the pair of logical operation signals and outputs the latched logical operation signals to a data output driver 400. A buffer 500 buffers data signals outputted from the data output driver 400, thereby generating a test pass or fail signal.

TABLE 3

| Line | Data | Line | Data | Line | Data | Line | Data | Line | Data | Pin | Data |
|---|---|---|---|---|---|---|---|---|---|---|---|
| D0 | Low | GRIO0 | High | CU | High | PU | Low | A | High | Data output pin | Low |
| D1 | Low | GRIO1 | High | | | | | | | | |
| D2 | Low | GRIO2 | High | | | | | | | | |
| D3 | Low | GRIO3 | High | | | | | | | | |
| D0Z | High | GRIO0Z | Low | CD | Low | PD | High | B | High | | |
| D1Z | High | GRIO1Z | Low | | | | | | | | |
| D2Z | High | GRIO2Z | Low | | | | | | | | |
| D3Z | High | GRIO3Z | Low | | | | | | | | |

As shown in Table 3, when the conventional semiconductor memory device having the parallel test mode simultaneously tests each memory cell contained in the four memory cell blocks to which a logic low signal has been written, the conventional semiconductor memory device generates the test pass signal, i.e., the logic low signal.

TABLE 4

| Line | Data | Line | Data | Line | Data | Line | Data | Line | Data | Pin | Data |
|---|---|---|---|---|---|---|---|---|---|---|---|
| D0 | High | GRIO0 | Low | CU | Low | PU | High | A | Low | Data output pin | High |
| D1 | High | GRIO1 | Low | | | | | | | | |
| D2 | High | GRIO2 | Low | | | | | | | | |
| D3 | High | GRIO3 | Low | | | | | | | | |
| D0Z | Low | GRIO0Z | High | CD | High | PD | Low | B | Low | | |
| D1Z | Low | GRIO1Z | High | | | | | | | | |
| D2Z | Low | GRIO2Z | High | | | | | | | | |
| D3Z | Low | GRIO3Z | High | | | | | | | | |

As shown in Table 4, when the conventional semiconductor memory device having the parallel test mode simultaneously tests each memory cell contained in the four memory cell blocks to which a logic high signal has been written, the conventional semiconductor memory device generates the test pass signal, i.e., the logic high signal.

TABLE 5

| Line | Data | Line | Data | Line | Data | Line | Data | Line | Data | Pin | Data |
|---|---|---|---|---|---|---|---|---|---|---|---|
| D0 | High | GRIO0 | Low | CU | Low | PU | Low | A | High | Data output pin | Hi-Z |
| D1 | High | GRIO1 | Low | | | | | | | | |
| D2 | Low | GRIO2 | High | | | | | | | | |
| D3 | High | GRIO3 | Low | | | | | | | | |
| D0Z | Low | GRIO0Z | High | CD | Low | PD | Low | B | Low | | |
| D1Z | Low | GRIO1Z | High | | | | | | | | |
| D2Z | High | GRIO2Z | Low | | | | | | | | |
| D3Z | Low | GRIO3Z | High | | | | | | | | |

As shown in Table 5, when the conventional semiconductor memory device having the parallel test mode simultaneously tests each memory cell contained in the four memory cell blocks to which the logic high or low signal has been written, the conventional semiconductor memory device generates the test fail signal, i.e., the Hi-Z signal.

There was a problem that a chip size of the conventional semiconductor memory device having the parallel test mode may be excessively increased because the conventional semiconductor memory device having the parallel test mode has too many global data bus lines.

SUMMARY OF THE INVENTION

It is therefore, an object of the present invention to provide a semiconductor memory device having a parallel test mode, which an effectively reduce the number of global data bus lines by using a plurality of logical operations circuits, to thereby decreasing a chip size.

In accordance with an aspect of the present invention, there is provided a semiconductor memory device having a parallel test mode for simultaneously testing a plurality of memory cells, comprising: a memory cell array having N numbers of memory cell blocks, wherein each memory cell block includes the plurality of memory cells and outputs first and second complementary data signals, the N being a positive integer; M numbers of first logical operation means responsive to a parallel test mode enable signal, each first logical operation means for carrying out a logical operation with respect to first and second complementary data signals outputted from at least two memory cell blocks, thereby generating first and second logical operation signals, wherein the N is greater than the M; a second logical operation means for carrying out the logical operation with respect to the first and second logical operation signals, thereby generating third and fourth logical operation signals; a pair of global data bus lines coupled between each of first logical operation means and said second logical operation means; and a generation means coupled to said second logical operation means for generating a test pass signal when the third and fourth logical operation signals are not the same as each other.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Figure 3:
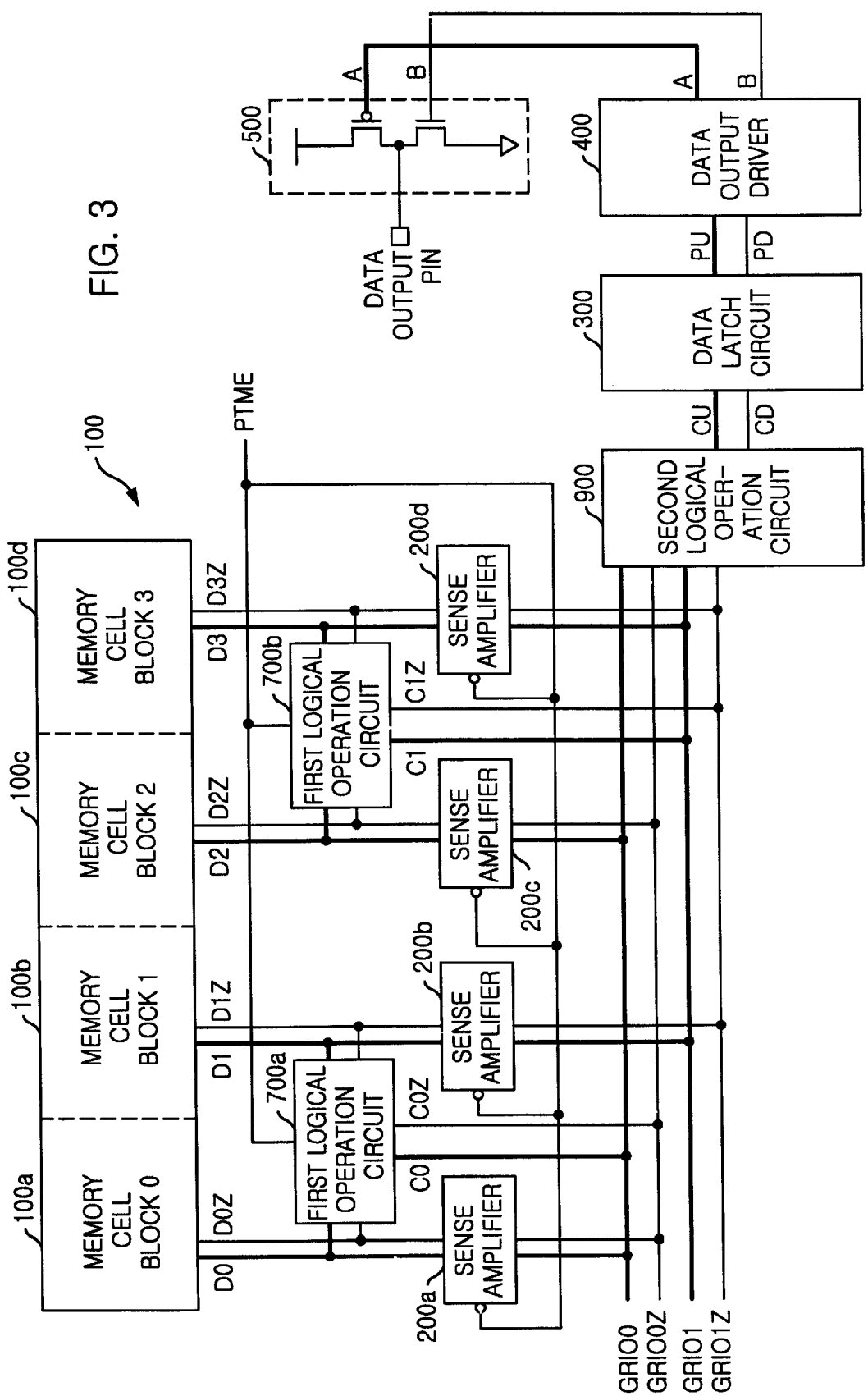
FIG. 3 is a block diagram showing a semiconductor memory device having a parallel test mode in accordance with a first embodiment of the present invention.

Referring to FIG. 3, there is shown a block diagram showing a semiconductor memory device having a parallel test mode for simultaneously testing a plurality of memory cells in accordance with a first embodiment of the present invention. As shown, the semiconductor memory device having the parallel test mode includes a memory cell array 100, first logical operation circuits 700a and 700b, sense amplifiers 200a to 200d, a second logical operation circuit 900, a data latch circuit 300, a data output driver 400 and a buffer 500. The memory cell array 100 has memory cell blocks 100a, 100b, 100c and 100d.

Although the memory cell array 100 shown in FIG. 3 has four memory cell blocks, the memory cell array 100 can be made up of N numbers of memory cell blocks where N is a positive integer. At this time, the N numbers of memory cell blocks are associated with M numbers of first logical operation circuits, wherein N is greater than M. For example, the memory cell blocks 100a to 100d are associated with the first logical operation circuits 700a and 700b.

The sense amplifier 200a amplifies complementary data signals received from the memory cell block 100a through complementary data lines D0 and D0Z and sends the amplified complementary data signals to global data bus lines GRIO0 and GRIO0Z. The sense amplifier 200b amplifies complementary data signals received from the memory cell block 100b through complementary data lines D1 and D1Z and sends the amplified complementary data signals to global data bus lines GRIO1 and GRIO1Z. The sense amplifier 200C amplifies complementary data signals received from the memory cell block 100C through complementary data lines D2 and D2Z and sends the amplified complementary data signals to global data bus lines GRIO0 and GRIO0Z. The sense amplifier 200d amplifies complementary data signals received from the memory cell block 100d through complementary data lines D3 and D3Z and sends the amplified complementary data signals to global data bus lines GRIO1 and GRIO1Z. The sense amplifiers 200a to 200d are not operable in response to a parallel test mode enable (PTME) signal at a parallel test mode, respectively.

The first logical operation circuit 700a, as a data compression circuit, is coupled to the memory cell blocks 100a and 100b. In response to the PTME signal at the parallel test mode, the first logical operation circuit 700a carries out a logical operation with respect to the complementary data signals from the complementary data lines D0 and D1 and the complementary data lines D0Z and D1Z outputted from the memory cell blocks 100a and 100b thereby generating first and second logical operation signals. Then, the first logical operation circuit 700a sends the first and second logical operation signals to lines C0 and C0Z. For example, when the complementary data lines D0 and D1 convey a logic low signal, respectively, the line C0Z convey the logic low signal as the first logical operation signal from the first logical operation circuit 700a as shown in Table 6. Further, when the complementary data lines D0Z and D1Z convey a logic high signal, respectively, the line C0 conveys the logic high signal as the second logic operation signal from the first logical operation circuit 700a as shown in Table 6.

In response to the PTME signal at the parallel test mode, the first logical operation circuit 700b carries out the logical operation with respect to the complementary data signals from the complementary data lines D2 and D3 and the complementary data lines D2Z and D3Z outputted from the memory cell blocks 100c and 100d, thereby generating the first and second logical operation signals. Then, the first logical operation circuit 700b sends the first and second logical operation signals to lines C1 and C2Z. For example, when the complementary data lines D2 and D3 convey the logic low signal, respectively, the line C1Z conveys the logic low signal at the first logical operation signal from the first logical operation circuit 700b as shown in Table 6. Further, when the complementary data lines D2Z and D3Z convey the logic high signal, respectively, the line C1 conveys the logic high signal as the second logical operation signal from the first logical operation circuit 700b as shown in Table 6.

The second logical operation circuit 900 receives the first and second logical operation signals from the first logical operation circuit 700a, coupled to the global data bus lines GRIO0 and GRIO0Z, and the first logical operation circuit 700b, coupled to the global data bus lines GRIO1 and GRIO1Z.

Then, the second logical operation circuit 900 carries out the logical operation with respect to the first logical operation signals from the global data bus lines GRIO0Z and GRIO1Z, thereby generating a third logical operation signal. Then, the second logical operation circuit 900 sends the third logical operation signal to line CD. For example, when the global data bus lines GRIO0Z and GRIO1Z convey the logic low signal, respectively, the line CD conveys the logic low signal as the third logical operation signal from the second logical operation circuit 900 as shown in Table 6.

Simultaneously, the second logical operation circuit 900 carries out the logical operation with respect to the second logical operation signals from the global data bus lines GRIO0 and GRIO1, thereby generating a fourth logical operation signal. Then, the second logical operation circuit 900 sends the fourth logical operation signal to line CU. For example, when the global data bus lines GRIO0 and GRIO1 convey the logical high signal, respectively, the line CU conveys the logic high signal as the fourth logical operation signal from the second logical operation circuit 900 as shown in Table 6.

When the third and fourth logical operation signals are not the same as each other, the buffer 500 generates a test pass signal, i.e. the logic low signal and sends the test pass signal to a output data pin. Otherwise, the buffer 500 generates a test fail signal and sends the test fail signal to the output data pin.

The lines CU and CD convey the third and fourth logical operation signals from the second logical operation circuit 900 to the data latch circuit 300. The data latch circuit 300 latches the third and fourth logical operation signals and outputs the latched third and fourth logical operation signals to the data output driver 400 through lines PU and PD. The buffer 500 buffers data signals from outputted the data output driver 400, thereby generating the test pass or fail signal.

TABLE 6

| Line | Data | Line | Data | Line | Data | Line | Data | Line | Data | Line | Data | Pin | Data |
|---|---|---|---|---|---|---|---|---|---|---|---|---|---|
| D0Z | High | C0 | High | GRIO0 | High | CU | High | PU | Low | A | High | Data output pin | Low |
| D1Z | High | | | | | | | | | | | | |
| D2Z | High | C1 | High | GRIO1 | High | | | | | | | | |
| D3Z | High | | | | | | | | | | | | |
| D0 | Low | C0Z | Low | GRIO0Z | Low | CD | Low | PD | High | B | High | | |
| D1 | Low | | | | | | | | | | | | |
| D2 | Low | C1Z | Low | GRIO1Z | Low | | | | | | | | |
| D3 | Low | | | | | | | | | | | | |

As shown in Table 6, when the semiconductor memory device having the parallel test mode simultaneously tests each memory cell contained in the four memory cell blocks to which a logic low signal has been written, the semiconductor memory device generates the test pass signal, i.e., the logic low signal.

TABLE 7

| Line | Data | Line | Data | Line | Data | Line | Data | Line | Data | Line | Data | Pin | Data |
|---|---|---|---|---|---|---|---|---|---|---|---|---|---|
| D0Z | Low | C0 | Low | GRIO0 | Low | CU | Low | PU | High | A | Low | Data output pin | High |
| D1Z | Low | | | | | | | | | | | | |
| D2Z | Low | C1 | Low | GRIO1 | Low | | | | | | | | |
| D3Z | Low | | | | | | | | | | | | |
| D0 | High | C0Z | High | GRIO0Z | High | CD | High | PD | Low | B | Low | | |
| D1 | High | | | | | | | | | | | | |
| D2 | High | C1Z | High | GRIO1Z | High | | | | | | | | |
| D3 | High | | | | | | | | | | | | |

As shown in Table 7, when the semiconductor memory device having the parallel test mode simultaneously tests each memory cell contained in the four memory cell blocks to which a logic high signal has been written, the semiconductor memory device generates the test pass signal, i.e., the logic high signal.

TABLE 8

| Line | Data | Line | Data | Line | Data | Line | Data | Line | Data | Line | Data | Pin | Data |
|---|---|---|---|---|---|---|---|---|---|---|---|---|---|
| D0Z | Low | C0 | Low | GRIO0 | Low | CU | Low | PU | Low | A | High | Data output pin | Hi-Z |
| D1Z | Low | | | | | | | | | | | | |
| D2Z | High | C1 | Low | GRIO1 | Low | | | | | | | | |
| D3Z | Low | | | | | | | | | | | | |
| D0 | High | C0Z | High | GRIO0Z | High | CD | Low | PD | Low | B | Low | | |
| D1 | High | | | | | | | | | | | | |
| D2 | Low | C1Z | Low | GRIO1Z | Low | | | | | | | | |
| D3 | High | | | | | | | | | | | | |

As shown in Table 8, when the semiconductor memory device having the parallel test mode simultaneously tests each memory cell contained in the four memory cell blocks to which the logic high or low signal has been written, the semiconductor memory device generates the test fail signal, i.e., the Hi-Z signal.

Figure 1:
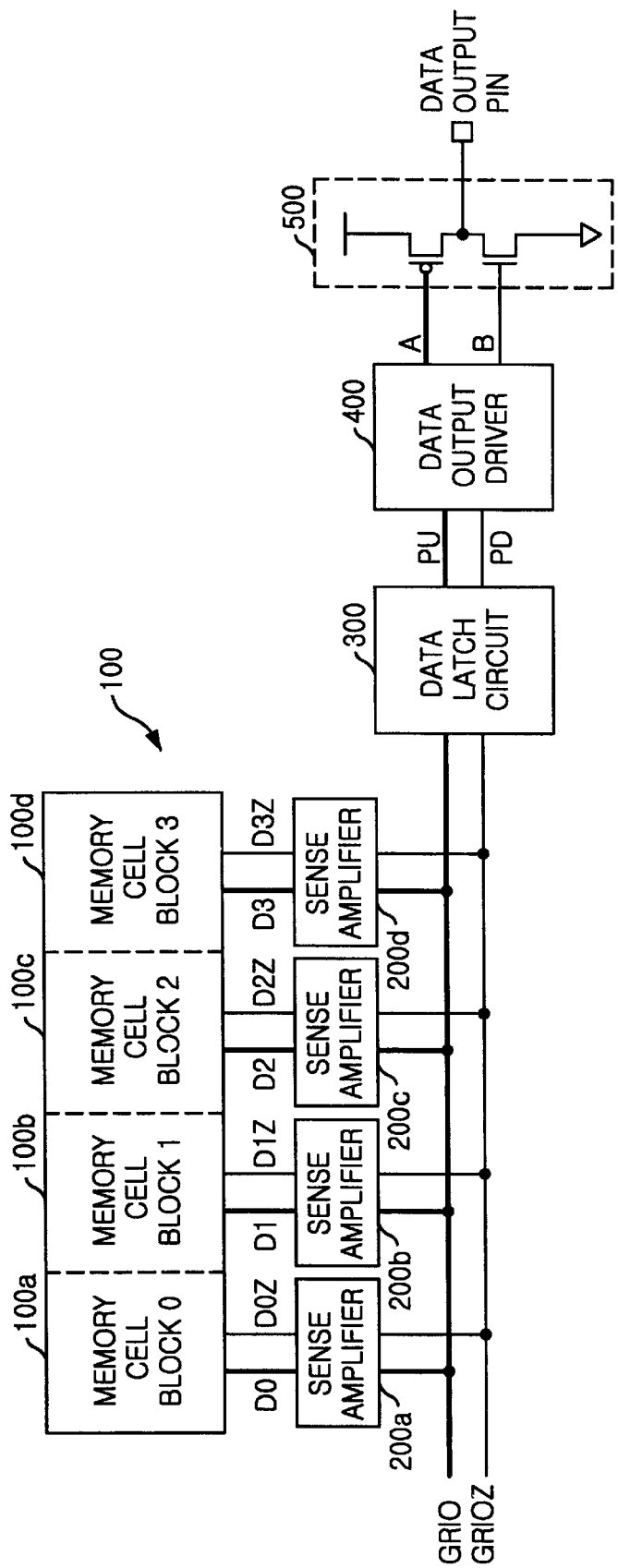
FIG. 1 is a block diagram illustrating a conventional dynamic random access memory (DRAM) device.
Figure 2:
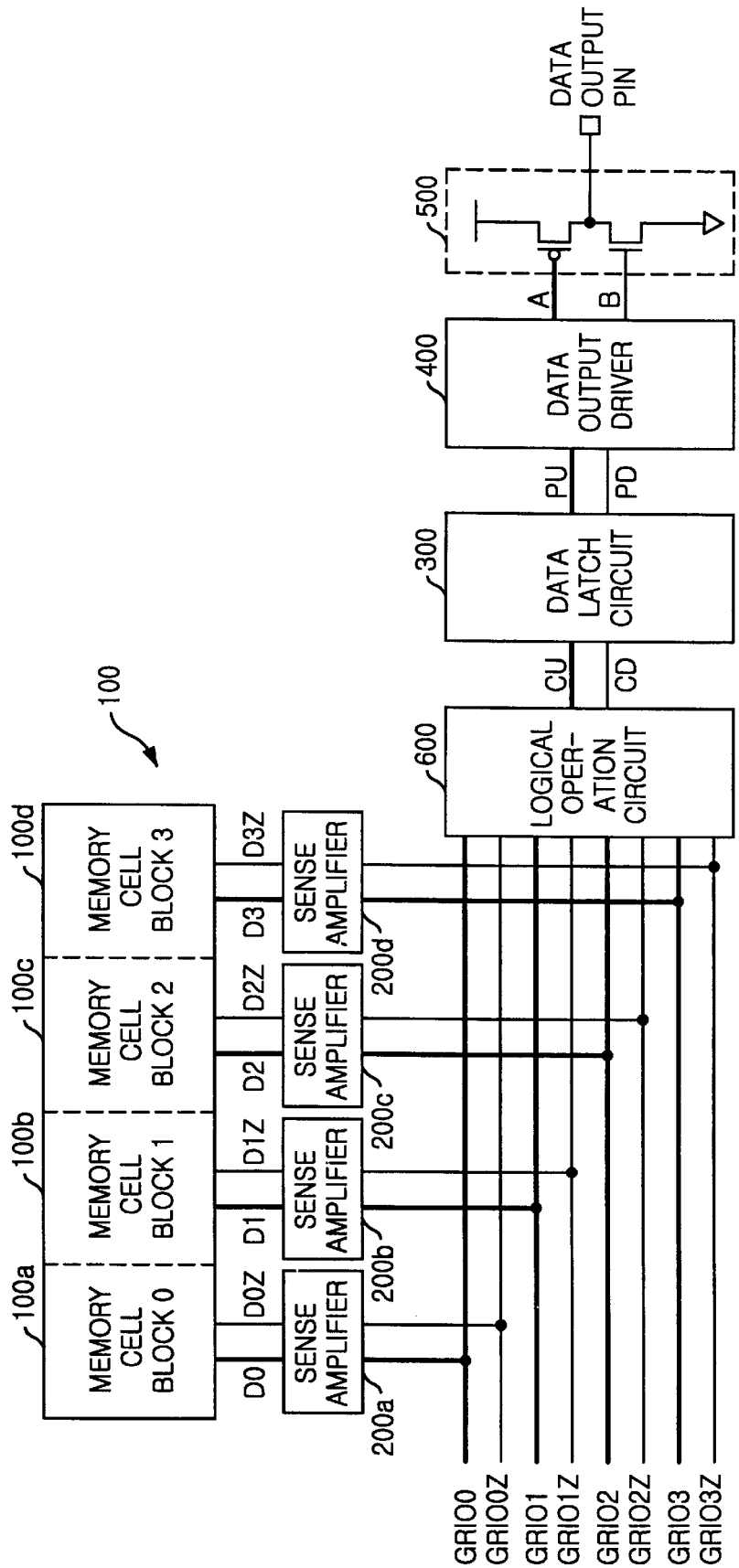
FIG. 2 is a block diagram depicting a conventional semiconductor memory device having a parallel test mode.

Accordingly, as compared with the conventional semiconductor memory device having the parallel test mode shown in FIG. 2, the conventional semiconductor memory device having the parallel test mode in accordance with the present invention can effectively reduce the number of global data bus lines by using the first logical operation circuits 700a and 700b shown in FIG. 3.

Figure 4A:
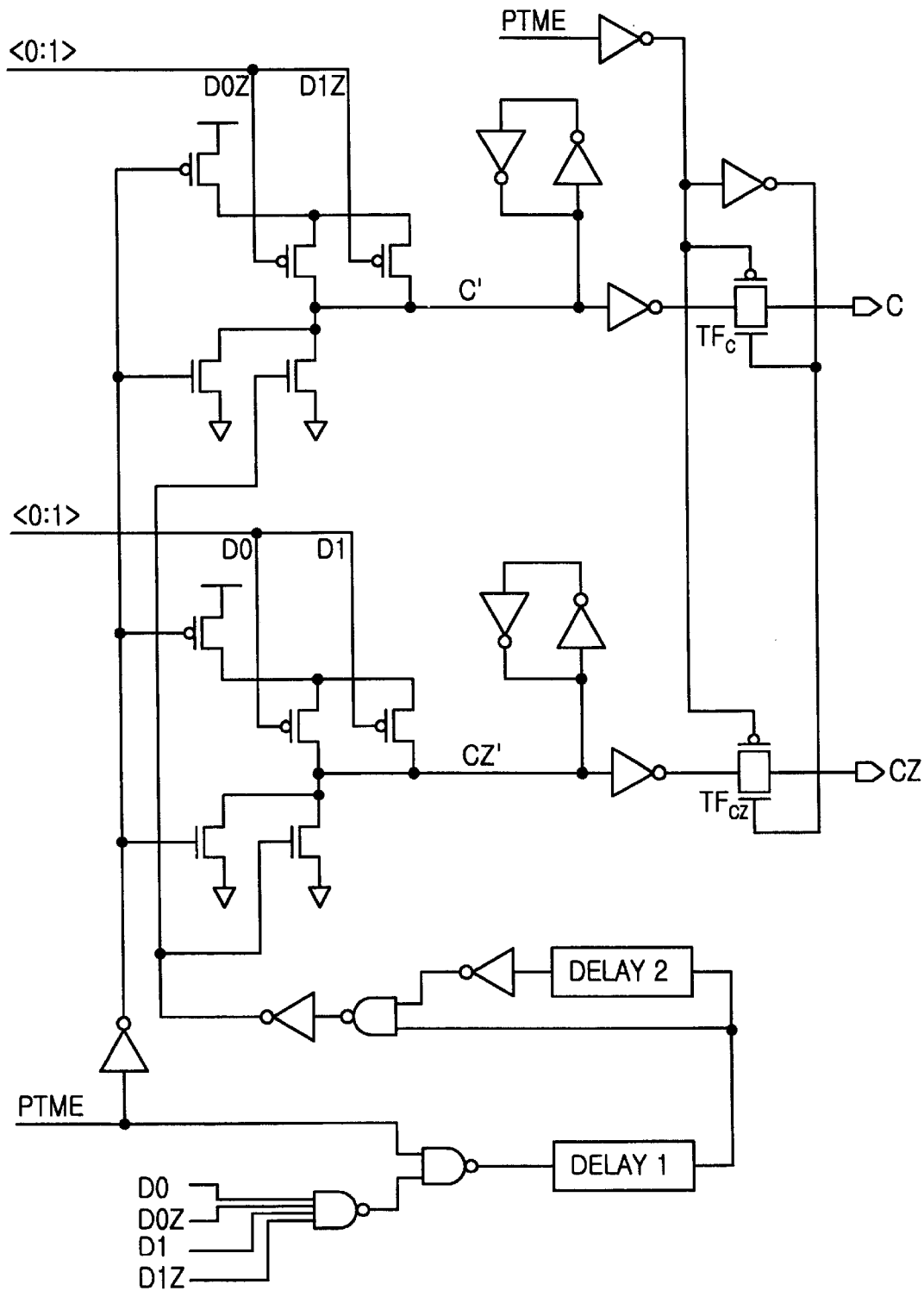
FIG. 4A is a circuit diagram describing a first logical operation circuit shown in FIG. 3.

Referring to FIG. 4A, there is shown a circuit diagram describing a first logical operation circuit shown in FIG. 3. As shown, the first logical operation circuit includes transfer gates $TF_c$ and $TF_{cz}$, which are responsive to a PTME signal. Where the PTME signal is low, the transfer gates $TF_c$ and $TF_{cz}$ are turned off, respectively. Further, where the PTME signal is high, the transfer gates $TF_c$ and $TF_{cz}$ are turned on, respectively.

Figure 4B:
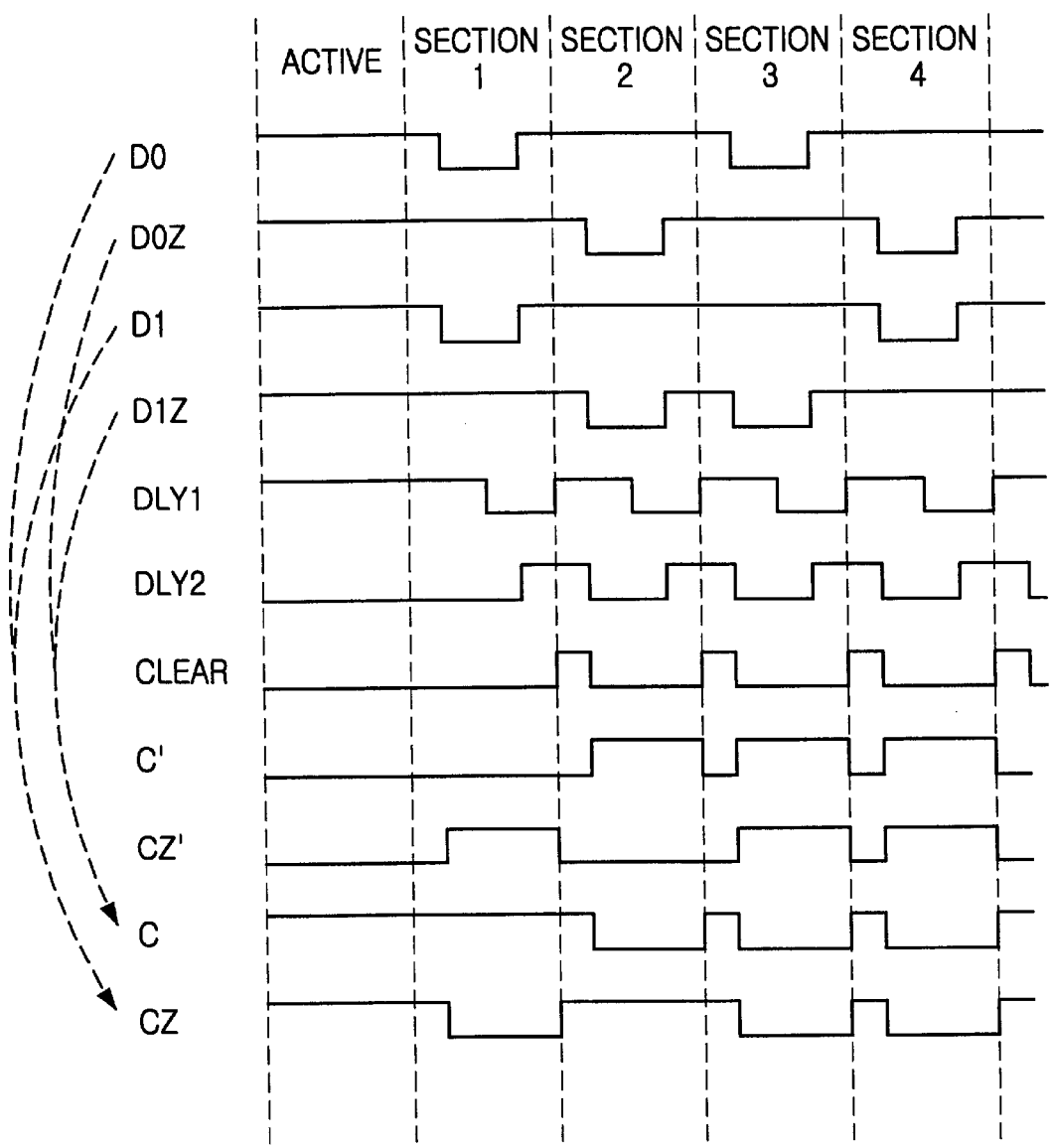
FIG. 4B is a timing diagram showing an operation of a first logical operation circuit shown in FIG. 4A.

Referring to FIG. 4B, there is shown a timing diagram showing an operation of a first logical operation circuit shown in FIG. 4A. As shown, where the first logical operation circuit carries out a logical operation at a section 1 or 2, the semiconductor memory device having the parallel test mode shown in FIG. 3 generates a test pass signal. Further, where the first logical operation circuit carries out a logical operation at a section 3 or 4, the semiconductor memory device having the parallel test mode shown in FIG. 3 generates a test fail signal.

Figure 5:
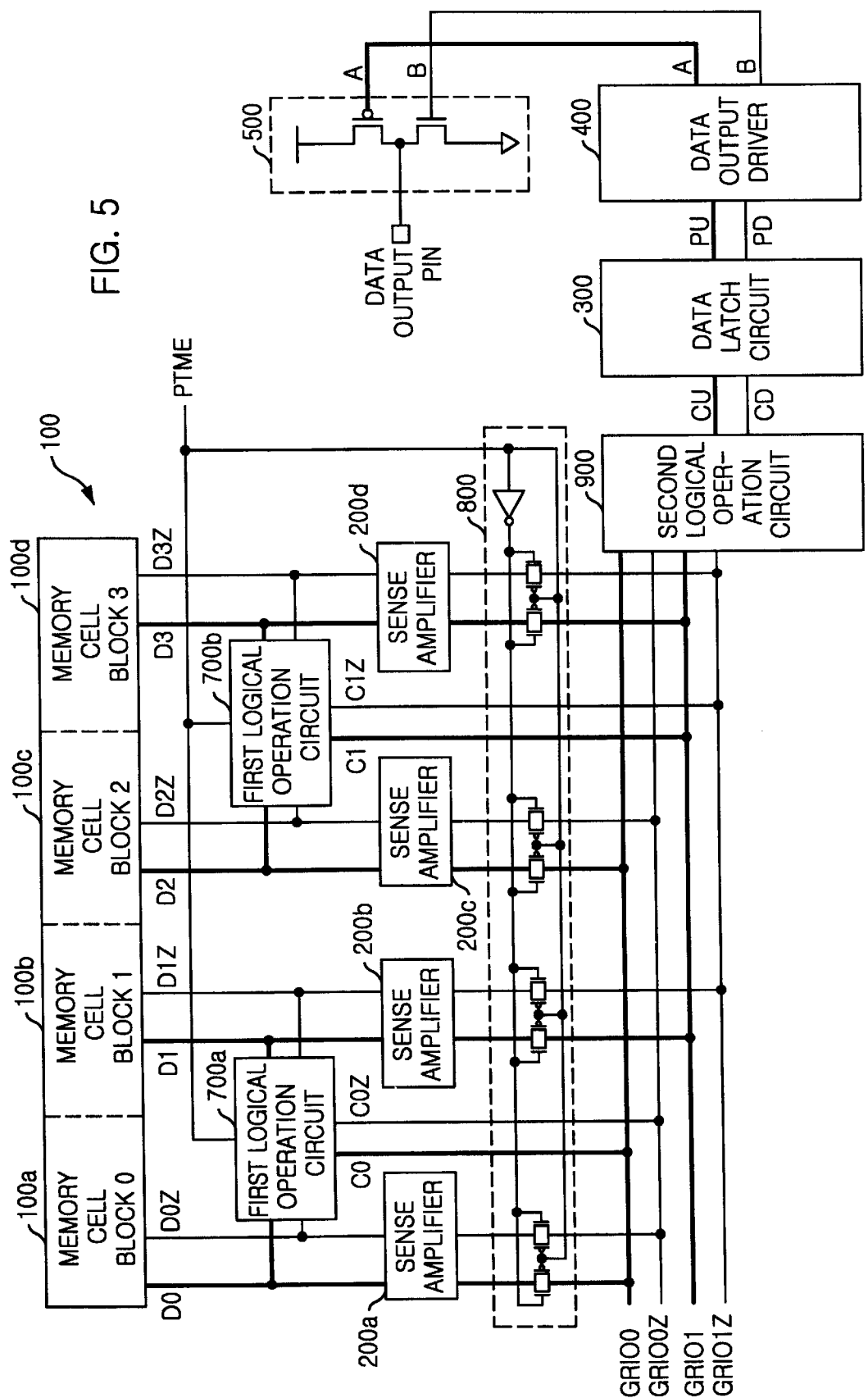
FIG. 5 is a block diagram illustrating a semiconductor memory device having a parallel test mode in accordance with a second embodiment of the present invention.

Referring to FIG. 5, there is shown a semiconductor memory device having a parallel test mode in accordance with a second embodiment of the present invention. As compared with the semiconductor memory device in accordance with the first embodiment of the present invention, the semiconductor memory device in accordance with the second embodiment of the present invention further includes a set of pass gates 800 as switching elements coupled between sense amplifiers 200a to 200d and second logical operation circuit 900.

At this time, first logical operation circuits 700a and 700b are coupled to lines between a memory cell array 100 and the sense amplifiers 200a to 200d. At the parallel test mode, the first and second logical operation circuits 700a, 700b and 900 are enabled in response to a PTME signal. The set of pass gates 800 is disabled or turned off in response to the PTME signal.

Figure 6:
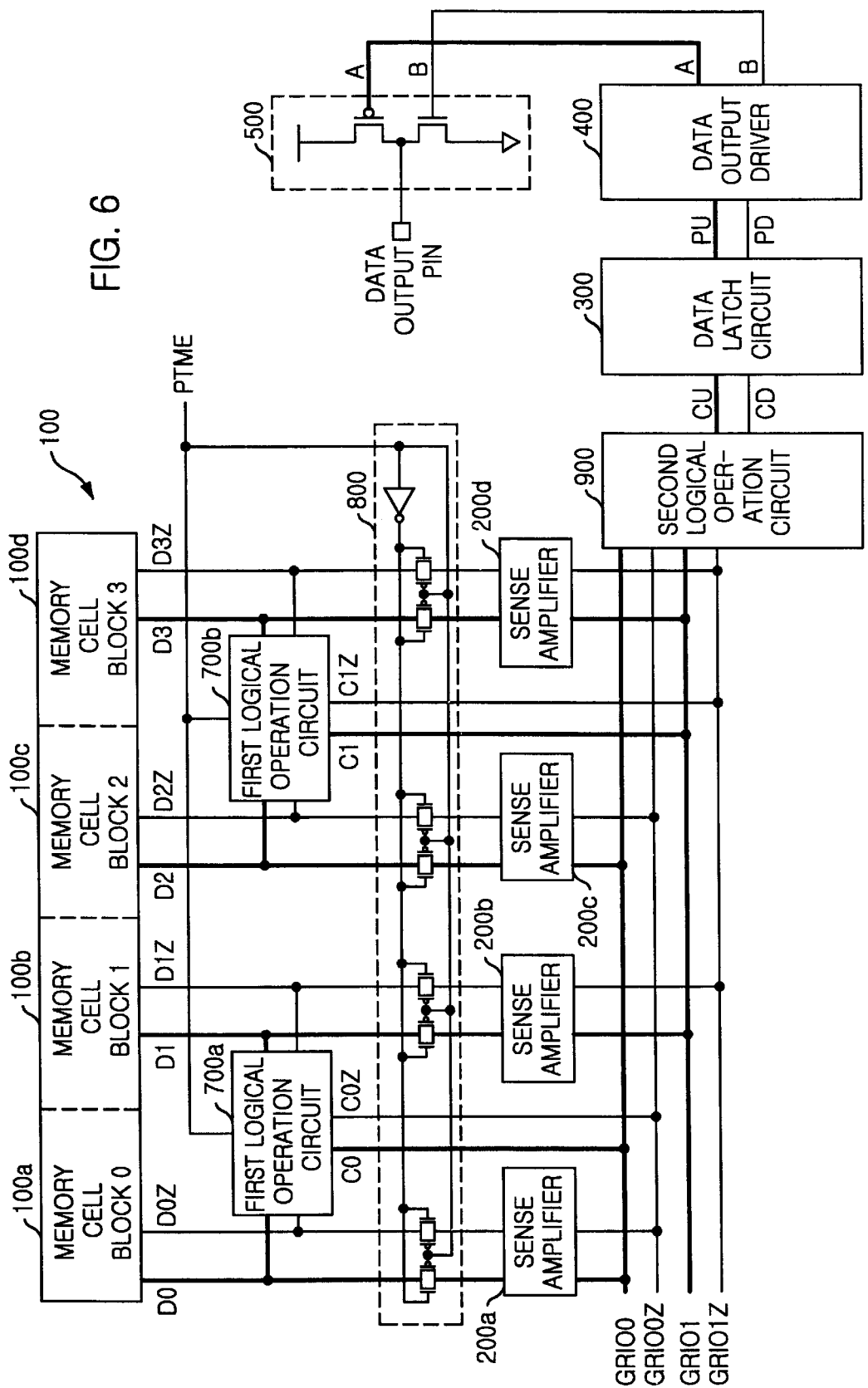
FIG. 6 is a block diagram illustrating a semiconductor memory device having a parallel test mode in accordance with a third embodiment of the present invention.

Referring to FIG. 6, there is shown a block diagram illustrating a semiconductor memory device having a parallel test mode in accordance with a third embodiment of the present invention. As compared with the semiconductor memory device in accordance with the first embodiment of the present invention, the semiconductor memory device in accordance with the third embodiment of the present invention further includes a set of pass gates 800 as switching elements coupled between sense amplifiers 200a to 200d and a memory cell array 100. As this time, first logical operation circuits 700a and 700b are coupled to lines between the memory cell array 100 and the set of pass gates 800.

Figure 7:
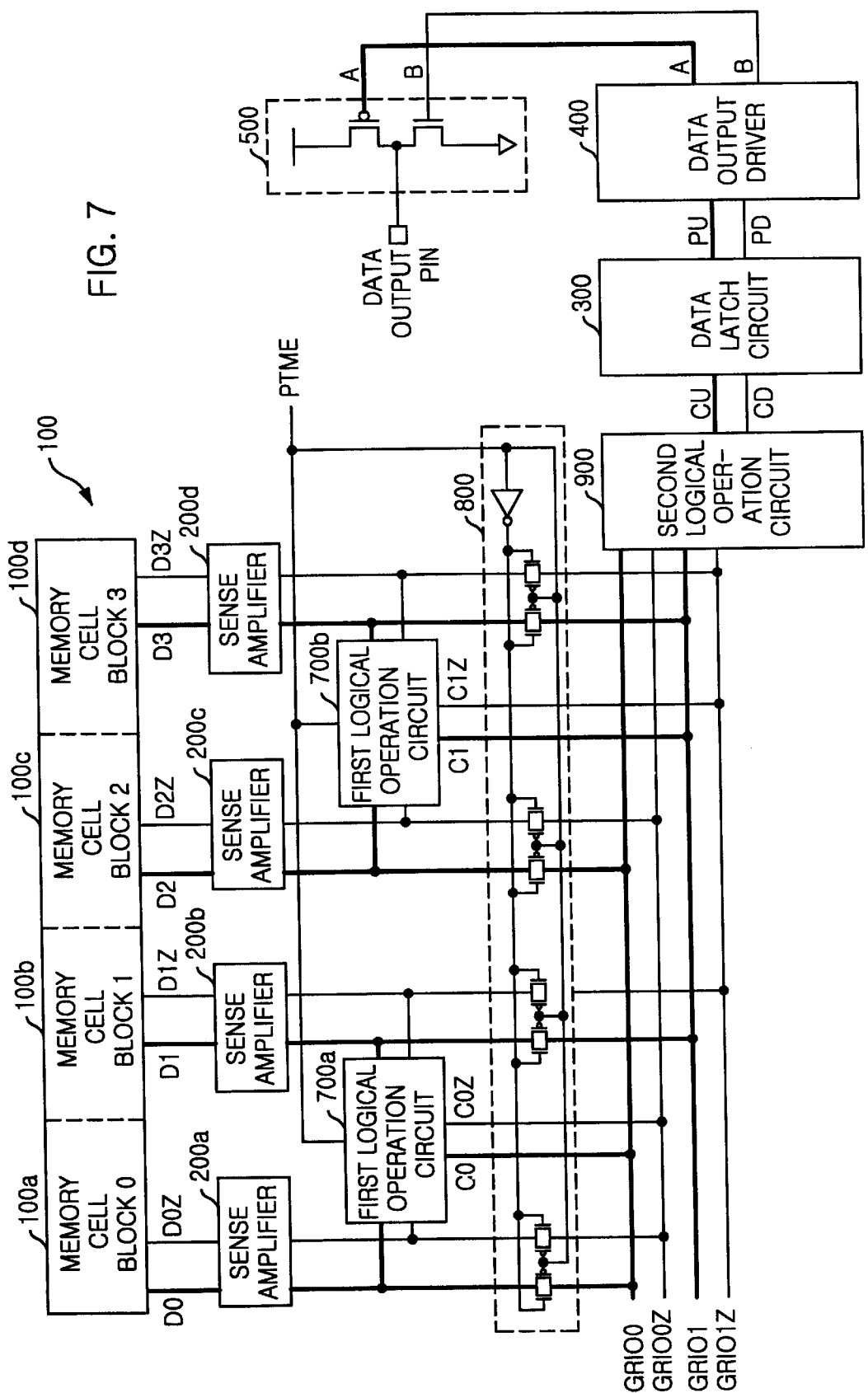
FIG. 7 is a block diagram illustrating a semiconductor memory device having a parallel test mode in accordance with a fourth embodiment of the present invention.

Referring to FIG. 7, there is shown a block diagram illustrating a semiconductor memory device having a parallel test mode in accordance with a fourth embodiment of the present invention. As compared with the semiconductor memory device in accordance with the first embodiment of the present invention, the semiconductor memory device in accordance with the fourth embodiment of the present invention further includes a set of pass gates 800 as switching elements coupled between sense amplifiers 200a to 200d and second logical operation circuit 900. At this time, first logical operation circuits 700a and 700b are coupled to lines between the set of pass gates 800 and the sense amplifiers 200a to 200d.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device having a parallel test mode for simultaneously testing a plurality of memory cells, comprising:

a memory cell array having N numbers of memory cell blocks, wherein each memory cell block includes the plurality of memory cells and outputs first and second complementary data signals, the N being a positive integer;

M numbers of first logical operation means responsive to a parallel test mode enable signal, each first logical operation means for carrying out a logical operation with respect to first and second complementary data signals outputted from at least two memory cell blocks, thereby generating first and second logical operation signals, wherein the N is greater than the M;

a second logical operation means for carrying out the logical operation with respect to the first and second logical operation signals, thereby generating third and fourth logical operation signals;

a pair of global data bus lines coupled between each of first logical operation means and said second logical operation means; and a generation means coupled to said second logical operation means for generating a test pass signal when the third and fourth logical operation signals are not the same as each other.

2. The semiconductor memory device as recited in claim 1, wherein said generation means generates a test fail signal when the third and fourth logical operation signals are the same as each other.

3. The semiconductor memory device as recited in claim 2, wherein the test fail signal includes a high impedance signal having a level between a logic high signal and a logic low signal.

4. The semiconductor memory device as recited in claim 2, wherein said generation means generates a test fail signal as a high impedance signal when said semiconductor memory device simultaneously tests each memory cell contained in said N numbers of memory cell blocks to which a logic low or high signal has been written.

5. The semiconductor memory device as recited in claim 1, further comprising:

N numbers of sense amplifiers coupled to said N numbers of memory cell blocks for amplifying first and second complementary data signals outputted from said N numbers of memory cell blocks at a read operation and sending the amplified first and second complementary data signals to pairs of global data bus lines.

6. The semiconductor memory device as recited in claim 5, wherein said N numbers of sense amplifiers are disabled in response to the parallel test mode enable signal at the parallel test mode.

7. The semiconductor memory device as recited in claim 6, further comprising:

a switching means for switching the amplified first and second complementary data signals from said N numbers of sense amplifiers in response to the parallel test mode enable signal.

8. The semiconductor memory device as recited in claim 6, wherein said switching means is turned off in response to the parallel test mode enable signal at the parallel test mode.

9. The semiconductor memory device as recited in claim 6, wherein said switching means is turned on in response to the parallel test mode enable signal at the read operation.

10. The semiconductor memory device as recited in claim 6, wherein said switching means includes a set of pass gates.

11. The semiconductor memory device as recited in claim 6, wherein said switching means is coupled between said N numbers of sense amplifiers and said second logical operation means.

12. The semiconductor memory device as recited in claim 11, wherein said M numbers of first logical operation means are coupled to lines between said memory cell array and said N numbers of sense amplifiers.

13. The semiconductor memory device as recited in claim 11, wherein said M numbers of first logical operation means are coupled to lines between said N numbers of sense amplifiers and said switching means.

14. The semiconductor memory device as recited in claim 6, wherein said switching means is coupled between said memory cell array and said N numbers of sense amplifiers.

15. The semiconductor memory device as recited in claim 14, wherein said M numbers of first logical operation means are coupled to lines between said memory cell array and said switching means.

16. The semiconductor memory device as recited in claim 1, wherein said generation means generates a test fail signal as a logic low signal when said semiconductor memory device simultaneously tests each memory cell contained in said N numbers of memory cell blocks to which the logic low signal has been written.

17. The semiconductor memory device as recited in claim 1, wherein said generation means generates a test fail signal as a logic high signal when said semiconductor memory device simultaneously tests each memory cell contained in said N numbers of memory cell blocks to which the logic high signal has been written.

18. The semiconductor memory device as recited in claim 1, wherein the N and the M are 4 and 2, respectively.

19. The semiconductor memory device as recited in claim 1, wherein the N and the M are 6 and 2, respectively.

20. The semiconductor memory device as recited in claim 1, wherein said first and second logical operation means include a data compression circuit, respectively.

21. The semiconductor memory device as recited in claim 1, wherein the logical operation includes a logical AND operation.

* * * * *